United States Patent
Kräuter

(10) Patent No.: US 9,142,713 B2
(45) Date of Patent: Sep. 22, 2015

(54) OPTOELECTRONIC SEMICONDUCTOR COMPONENT

(75) Inventor: Gertrud Kräuter, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/115,396

(22) PCT Filed: Mar. 28, 2012

(86) PCT No.: PCT/EP2012/055552
§ 371 (c)(1),
(2), (4) Date: Jan. 23, 2014

(87) PCT Pub. No.: WO2012/152502
PCT Pub. Date: Nov. 15, 2012

(65) Prior Publication Data
US 2014/0175500 A1    Jun. 26, 2014

(30) Foreign Application Priority Data
May 6, 2011 (DE) .................. 10 2011 100 728

(51) Int. Cl.
*H01L 33/02* (2010.01)
*H01L 33/56* (2010.01)
*H01L 33/44* (2010.01)
*H01L 33/50* (2010.01)

(52) U.S. Cl.
CPC ............... *H01L 33/02* (2013.01); *H01L 33/56* (2013.01); *H01L 33/44* (2013.01); *H01L 33/501* (2013.01)

(58) Field of Classification Search
CPC ..................................... H01L 33/02
USPC .............................................. 257/99
See application file for complete search history.

(56) References Cited

U.S. PATENT DOCUMENTS

2008/0067918 A1    3/2008  Iwasaki et al.
2008/0096024 A1*   4/2008  Cavallin .................. 428/426
(Continued)

FOREIGN PATENT DOCUMENTS

DE    10 2008 020 324 A1    10/2009
DE    10 2009 036 621 A1    2/2011
(Continued)

OTHER PUBLICATIONS

"KDT HTA 1500/Ambient Curable Coating Resin (Product Code: K-1002)," Technical data sheet, Kion Defense Technologies, Inc., www.kiondefense.com.
(Continued)

*Primary Examiner* — Khaja Ahmad
(74) *Attorney, Agent, or Firm* — DLA Piper LLP (US)

(57) ABSTRACT

An optoelectronic semiconductor component includes at least one radiation-emitting semiconductor chip including a radiation-outcoupling face through which at least some of electromagnetic radiation generated in the semiconductor chip leaves the semiconductor chip; and at least one radiation-transmissive body arranged at least in places downstream of the semiconductor chip on its radiation-outcoupling face, which body is in at least indirect contact with the semiconductor chip, wherein the radiation-transmissive body is formed with at least one polymer or contains at least one polymer, and one monomer of the polymer is formed with at least one silazane.

8 Claims, 1 Drawing Sheet

(56) References Cited

U.S. PATENT DOCUMENTS

| | | | |
|---|---|---|---|
| 2008/0231170 A1* | 9/2008 | Masato et al. | 313/501 |
| 2008/0303044 A1* | 12/2008 | Kohno et al. | 257/98 |
| 2009/0115936 A1* | 5/2009 | Takeuchi et al. | 349/64 |
| 2010/0258830 A1* | 10/2010 | Ide et al. | 257/98 |
| 2010/0320479 A1* | 12/2010 | Minato et al. | 257/88 |

FOREIGN PATENT DOCUMENTS

| | | |
|---|---|---|
| JP | 2005-057239 A | 3/2005 |
| JP | 2008-244357 | 10/2008 |
| WO | 2011/105185 A1 | 9/2011 |
| WO | 2012/067766 A2 | 5/2012 |

OTHER PUBLICATIONS

Ilaria Menapace et al., "Luminescence of heat-treated silicon-based polymers: promising materials for LED applications," Journal of Materials Science, vol. 43, No. 17, May 8, 2008, pp. 5790-5796.

"HTA 1500 Rapid Cure/HTA 1500 Slow Cure/Polysilazan-basierte Polymere für Hochleistungsbeschichtungen," Technical data sheet, Clariant Advanced Materials GmbH, www.clariant.com.

Taiwanese Examination Report dated Feb. 24, 2014 for corresponding Taiwanese Application No. 101113442.

* cited by examiner

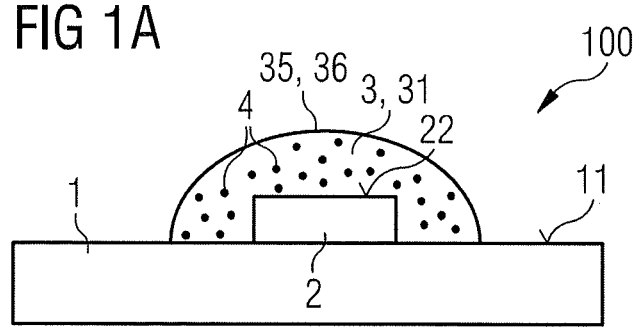
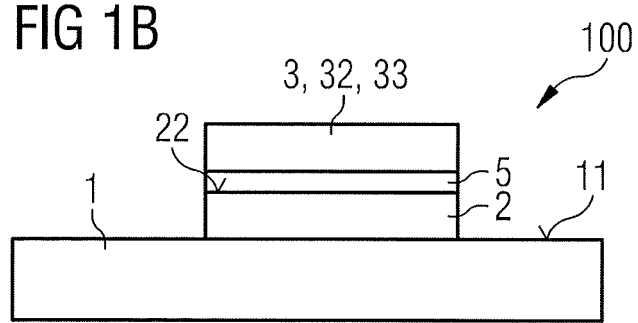
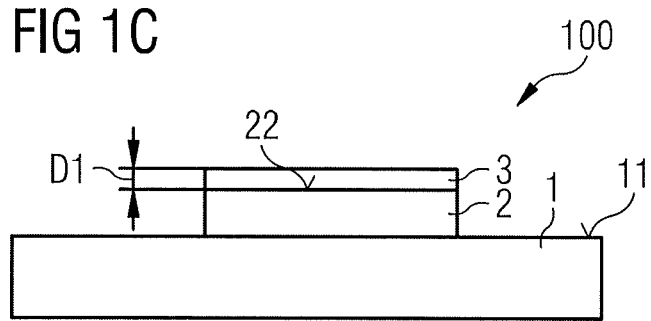

OPTOELECTRONIC SEMICONDUCTOR COMPONENT

TECHNICAL FIELD

This disclosure relates to an optoelectronic semiconductor component.

BACKGROUND

There is a need to provide an optoelectronic semiconductor component which is resistant to ageing.

SUMMARY

I provide an optoelectronic semiconductor component including at least one radiation-emitting semiconductor chip including a radiation-outcoupling face, through which at least some of electromagnetic radiation generated in the semiconductor chip leaves the semiconductor chip; and at least one radiation-transmissive body arranged at least in places downstream of the semiconductor chip on its radiation-outcoupling face, which body is in at least indirect contact with the semiconductor chip, wherein the radiation-transmissive body is formed with at least one polymer or contains at least one polymer, and one monomer of the polymer is formed with at least one silazane.

I also provide an optoelectronic semiconductor component including at least one radiation-emitting semiconductor chip including a radiation-outcoupling face, through which at least some of electromagnetic radiation generated in the semiconductor chip leaves the semiconductor chip; and at least one radiation-transmissive body arranged at least in places downstream of the semiconductor chip on its radiation-outcoupling face, which body is in at least indirect contact with the semiconductor chip, wherein the radiation-transmissive body includes traces of physical and/or mechanical material removal, the radiation-transmissive body is a lamina or a foil, at least one radiation-transmissive adhesion layer is arranged between the radiation-transmissive body and the radiation-outcoupling face, and the radiation-transmissive adhesion layer is formed with at least one polysilazane, includes at least one polysilazane or consists of a polysilazane, the radiation-transmissive body is formed with at least one polymer or contains at least one polymer, and one monomer of the polymer is formed with at least one silazane.

BRIEF DESCRIPTION OF THE DRAWINGS

FIGS. 1A to 1C are schematic side views of example of an optoelectronic semiconductor component described herein.

DETAILED DESCRIPTION

The optoelectronic semiconductor component may comprise at least one radiation-emitting semiconductor chip which comprises a radiation-outcoupling face, through which at least some of the electromagnetic radiation generated in the semiconductor chip leaves the semiconductor chip. The radiation-emitting semiconductor chip may, for example, comprise a luminescent diode chip. The luminescent diode chip may be a light-emitting or laser diode chip which emits radiation in the range of ultraviolet to infrared light. Preferably, the luminescent diode chip emits light in the visible or ultraviolet range of the spectrum of electromagnetic radiation.

The optoelectronic semiconductor component may comprise at least one radiation-transmissive body arranged at least in places downstream of the semiconductor chip on its radiation-outcoupling face, which body is in at least indirect contact with the semiconductor chip, i.e., the radiation-transmissive body is arranged downstream of the semiconductor chip such that at least some of the electromagnetic radiation generated when the semiconductor chip is in operation enters the radiation-transmissive body. "Radiation-transmissive" means in this connection that the body is at least 70%, preferably more than 85%, transmissive for electromagnetic radiation emitted by the radiation-emitting semiconductor chip. "Indirect contact" means that one or more layers may be arranged between the radiation-transmissive body and the semiconductor chip, for example, the radiation-outcoupling face thereof. The layers then space the radiation-transmissive body from the semiconductor chip at least in places. In other words, in this case the radiation-transmissive body is in contact with the semiconductor chip at least in places solely via these layers. "At least" means, in connection with "indirect contact," that the radiation-transmissive body may at least in places also be in direct contact with the semiconductor chip, for example, at the radiation-outcoupling face. In this case, the radiation-transmissive body and the semiconductor chip adjoin one another directly, neither a gap nor an interruption being formed at these locations.

The radiation-transmissive body may be formed with at least one polymer or contains at least one polymer, wherein in each case one monomer of the polymer is formed with at least one silazane, i.e., the silazane of at least one monomer of the polymer is a basic chemical building block and not just an optional substitutable additional chemical building block. For example, to form a polymer, silazane is contained in each monomer of the polymer. If the polymer is a copolymer, it is also possible for just one or several monomers of one monomer type of the polymer to be formed with at least one silazane. In other words, the silazane serves to form polymerization chains which form the material of the radiation-transmissive body.

The optoelectronic semiconductor component may comprise at least one radiation-transmissive semiconductor chip which comprises a radiation-outcoupling face through which at least some of the electromagnetic radiation generated in the semiconductor chip leaves the semiconductor chip. In addition, the optoelectronic semiconductor component comprises at least one radiation-transmissive body arranged at least in places downstream of the semiconductor chip on the radiation-outcoupling face thereof, which body is in at least indirect contact with the semiconductor chip. In this case, the radiation-transmissive body is formed with at least one polymer or contains at least one polymer, wherein in each case one monomer of the polymer is formed with at least one silazane.

The optoelectronic semiconductor component described herein is based in this case inter alia on the recognition that a radiation-transmissive body enclosing a semiconductor chip of a semiconductor component may, for example, exhibit damage after only a short period of operation of the semiconductor component. In particular, the radiation-transmissive body may exhibit damage in the vicinity of the semiconductor chip as a result of the thermal heating arising there and/or electromagnetic radiation acting on the radiation-transmissive body. For example, blue light emitted by the semiconductor chip brings about discoloration and/or cracks in such a radiation-transmissive body. Such damage to the radiation-transmissive body may shorten the service life not only of the radiation-transmissive body itself but also of the entire semiconductor component. In other words, such a semiconductor component is not very ageing-resistant.

To provide an optoelectronic semiconductor component in which such damage to the radiation-transmissive body is avoided and which is therefore ageing-resistant, the optoelectronic semiconductor component described herein makes use inter alia of the notion of the radiation-transmissive body being formed with at least one polymer or containing at least one polymer, one monomer of the polymer being formed with at least one silazane. Silazanes in particular exhibit both high thermal stability and high resistance when exposed to electromagnetic radiation, for example, when exposed to blue light. In other words, in the case of a radiation-transmissive body formed with such a material the above-described damage is avoided during operation of the semiconductor component. This results in an optoelectronic semiconductor component with high ageing resistance.

The polymer may be formed with at least one polysilazane or comprises at least one polysilazane. For example, the polymer consists completely of at least one polysilazane. For example, a material of the radiation-transmissive body formed with the polymer described herein, which body is initially present for application in liquid or highly viscous form, may be particularly simply applied to outer faces of the semiconductor chip and then cured, for example, at room temperature, i.e., at approx. 20° C., to yield the radiation-transmissive body. In particular, the material of the radiation-transmissive body may cure to yield the radiation-transmissive body in a temperature range as low as from at least room temperature to at most 220° C. In other words, it is possible, when curing the material, to dispense with troublesome heating of the material itself and/or of the semiconductor chip. Structural damage to the material of the radiation-transmissive body and of the semiconductor chip during curing may therefore be avoided at such low curing temperatures.

At least one luminescence conversion material may be introduced into the radiation-transmissive body which absorbs electromagnetic radiation of one wavelength range and reemits the absorbed electromagnetic radiation in another wavelength range with larger wavelengths than the absorbed radiation. For example, the luminescence conversion material converts blue light emitted by the semiconductor chip and entering the radiation-transmissive body partially into yellow light, which may then mix together with the blue light to yield white light.

The radiation-transmissive body may comprise traces of material removal, i.e., the radiation-transmissive body is, for example, physically post-treated and/or post-machined after application and subsequent curing and material is thereby removed. In other words, the radiation-transmissive body described herein may also be post-machined only once curing is complete, for example, by grinding and/or polishing without, for example, a tacky outer surface of the radiation-transmissive body wholly preventing such post-machining or at least making it more difficult. This results in an optoelectronic semiconductor component suitable for particularly customized and flexible use since the radiation-transmissive body may also be adapted to the user's individual requirement only after application and subsequent curing.

The radiation-transmissive body may contain at least one solvent and/or at least one thixotroping agent. For example, a material of the radiation-transmissive body may be present in liquid or highly viscous form before the body may cure to yield the radiation-transmissive body itself. By adding a solvent to the material, it is possible depending on the concentration of the solvent in the material, for example, to adjust the viscosity of the material of the radiation-transmissive body in a predeterminable manner. In this case, addition of a solvent may result in an increase in the viscosity of the material, i.e., in liquefaction of the material of the radiation-transmissive body, whereas addition of the thixotroping agent to the material of the radiation-transmissive body may result in a material which is highly viscous, for example, pasty prior to application.

The radiation-transmissive body may be a shaped article which envelops the semiconductor chip in form-fitting manner at least in places. In this case the shaped article may be produced, for example, by encapsulation or molding of the semiconductor chip. In particular, the semiconductor chip and the radiation-transmissive body then adjoin one another directly.

The radiation-transmissive body may be a lamina or a foil, at least one radiation-transmissive adhesion layer being arranged between the radiation-transmissive body and the radiation-outcoupling face. If the radiation-transmissive body is a lamina, it is preferably of self-supporting construction. In this case, the radiation-transmissive body may, for example, be applied by a pick and place method on an outer face of the adhesion layer remote from the semiconductor chip. If the radiation-transmissive body is a foil, in this case the radiation-transmissive body may be flexible and, for example, be applied to the outer face of the adhesion layer remote from the semiconductor chip by lamination. The adhesion layer allows a mechanically firm bond between the semiconductor chip and the radiation-transmissive body. In other words, the adhesion layer enables the radiation-transmissive body and the semiconductor chip to be of cohesive construction and form a unit.

The radiation-transmissive adhesion layer may be formed with at least one polysilazane, comprises at least one polysilazane or consists of at least one polysilazane. If the adhesion layer consists of at least one polysilazane, the latter is free of foreign particles. "Free of foreign particles" means that in the context of manufacturing tolerance particles of a foreign material are not introduced predeterminably into the adhesion layer. In this case, the adhesion layer comprises neither the luminescence conversion material described herein nor, for example, other foreign particles. As already described above, a mechanically firm bond is formed by the adhesion layer between the radiation-transmissive body and the semiconductor chip. If the adhesion layer is then formed with polysilazane, comprises a polysilazane or consists of polysilazane, the mechanical bond formed is particularly advantageous in terms of light diffusion and thermal stability. For example, using polysilazane for the adhesion layer and the radiation-transmissive body means that a material of identical refractive index is used such that the emitted light of the semiconductor chip is not subject to any other refractive index. Moreover, polymers consisting of the same starting material form bonds which are particularly thermally stable.

The radiation-transmissive body may be applied without bonding agent at least to the radiation-outcoupling face of the semiconductor chip by screen printing and/or spraying. "Without bonding agent" means that the radiation-transmissive body does not need any attaching means, for example, an additional adhesion layer or an adhesive, for attachment to the semiconductor chip. For example, the radiation-transmissive body covers further exposed outer faces of the semiconductor chip in addition to the radiation-outcoupling face. In this case, the radiation-transmissive body may also serve as sealing for the semiconductor chip. It is additionally feasible for the radiation-transmissive body to be applied to the semiconductor chip by rolling or spin coating in addition to application by screen printing and/or spraying.

The radiation-transmissive body and/or the adhesion layer may have a layer thickness of at least 5 µm and at most 50 µm. "Layer thickness" is a thickness of the radiation-transmissive body and/or the adhesion layer in a direction perpendicular to the radiation-outcoupling face and/or to further outer faces of the semiconductor chip. Such a thickness range of the radiation-transmissive body and/or the adhesion layer enables an optoelectronic semiconductor component to be achieved which extends only a small amount in the vertical direction, i.e., in a direction perpendicular to the main direction of extension of the optoelectronic semiconductor component. In other words, such an optoelectronic semiconductor component is flat and compact in structure.

The optoelectronic semiconductor component described herein is explained in greater detail below with reference to examples and the associated figures.

In the examples and figures, identical or identically acting components are provided with the same reference numerals. The elements shown should not be considered as being to scale, but rather individual elements may be shown exaggeratedly large to assist in understanding.

FIG. 1A shows in a schematic side view an optoelectronic semiconductor component 100 described herein. The optoelectronic semiconductor component 100 comprises a radiation-emitting semiconductor chip 2 which comprises a radiation-outcoupling face 22 through which at least some of the electromagnetic radiation generated in the semiconductor chip 2 leaves the semiconductor chip 2. The optoelectronic semiconductor component 100 further comprises a carrier 1 which comprises a mounting surface 11. The carrier 1 may comprise a carrier frame or leadframe. The carrier frame may then be formed with two metallic carrier strips which serve as electrical contact surfaces for the semiconductor chip 2. In this case, the semiconductor chip 2 is arranged on the mounting face 11 and there contacted electrically with the carrier 1. The optoelectronic semiconductor component 100 further comprises a radiation-transmissive body 3, which is constructed in FIG. 1A as a shaped article 31, i.e., the radiation-transmissive body 3 is applied both to the carrier 1 and the semiconductor chip 2 by encapsulation of the semiconductor chip 2. The radiation-transmissive body 3 is then in direct contact with the semiconductor chip 3 and the carrier 1. The radiation-transmissive body 3 therefore envelopes the semiconductor chip 2 in form-fitting manner and is in places in direct contact with the mounting face 11 of the carrier 1. In this case, as is clear from FIG. 1A, the radiation-transmissive body 3 is in places arranged downstream of the semiconductor chip 2 on the radiation-outcoupling face 22 thereof and is in direct contact with the radiation-outcoupling face 22.

The radiation-transmissive body 3 is formed with at least one polymer or contains at least one polymer, wherein in each case one monomer of the polymer is formed with at least one silazane. The polymer may in particular comprise a polysilazane. In addition, a luminescence conversion material 4 is introduced into the radiation-transmissive body 3, which material converts blue light emitted by the semiconductor chip 2 in part into yellow light, wherein the blue and the yellow light may mix together, for example, at an outer face 36 of the radiation-transmissive body 3 remote from the carrier 1 to yield white light. The outer face 36 of the radiation-transmissive body 3 is additionally made convex in shape with regard to the semiconductor chip 2. To this end, the radiation-transmissive body 3 is post-machined after curing, the post-machining resulting in traces 35 of material removal on the outer face 36. In other words, the traces 35 are produced in the outer face 36 of the radiation-transmissive body 3 by removal, for example, abrasion of the material thereof.

FIG. 1B shows a schematic side view of a further example of an optoelectronic semiconductor component 100 described herein. Unlike in the example shown in FIG. 1A, in FIG. 1B the radiation-transmissive body 3 comprises a lamina 32 or a foil 33, a radiation-transmissive adhesion layer 5 being arranged between the radiation-transmissive body 3 and the radiation-outcoupling face 22 of the semiconductor chip 2. The adhesion layer 5 may in particular be formed with at least one polysilazane, comprise a polysilazane or consist of a polysilazane. In this case, the radiation-transmissive adhesion layer 5 is applied directly to the radiation-outcoupling face 22 of the semiconductor chip 2 and is thus in direct contact therewith. The radiation-transmissive body 3 is arranged on an outer face of the radiation-transmissive adhesion layer 5 remote from the semiconductor chip 2, for example, using a pick and place method. The adhesion layer 5 allows a mechanically firm bond between semiconductor chip 2 and the radiation-transmissive body 3. In other words, in the example according to FIG. 1B the radiation-transmissive body 3 is in indirect contact with the radiation-emitting semiconductor chip 2 via the radiation-transmissive adhesion layer 5.

FIG. 1C shows a schematic side view of a further example of an optoelectronic semiconductor component 100 described herein. Unlike in FIG. 1B, the radiation-transmissive body 3 is applied to the radiation-outcoupling face 22 of the semiconductor chip 2 without bonding agent and is in direct contact with the radiation-outcoupling face 22. Application takes place, for example, by screen printing and/or spraying of the material of the radiation-transmissive body 3 onto the radiation-outcoupling face 22. In this case, in the example according to FIG. 1C the radiation-transmissive body 3 comprises a layer thickness D1 of at least 5 µm and at most 50 µm.

My components and methods are not restricted by the description given with reference to the examples. Rather, this disclosure encompasses any novel feature and any combination of features, including in particular any combination of features in the appended claims, even if the feature or combination is not itself explicitly indicated in the claims or the examples.

The invention claimed is:

1. An optoelectronic semiconductor component comprising:
   at least one radiation-emitting semiconductor chip comprising a radiation-outcoupling face, through which at least some of electromagnetic radiation generated in the semiconductor chip leaves the semiconductor chip; and
   at least one radiation-transmissive body arranged at least in places downstream of the semiconductor chip on its radiation-outcoupling face, which body is in at least indirect contact with the semiconductor chip, wherein
   the radiation-transmissive body is a lamina or a foil,
   at least one radiation-transmissive adhesion layer is arranged between the radiation-transmissive body and the radiation-outcoupling face,
   the radiation-transmissive adhesion layer consists of a polysilazane,
   the radiation-transmissive body is formed with at least one polymer or contains at least one polymer,
   one monomer of the polymer is formed with at least one silazane,
   at least one luminescence conversion material is introduced into the radiation-transmissive body, which absorbs electromagnetic radiation of one wavelengths range and reemits absorbed electromagnetic radiation in another wavelength range with larger wavelengths than wavelengths of the absorbed electromagnetic radiation, and the radiation-transmissive adhesion layer is free of the luminescence conversion material and other foreign particles within the context of manufacturing tolerance.

2. The optoelectronic semiconductor component according to claim 1, wherein the radiation-transmissive body comprises traces of physical and/or mechanical material removal.

3. The optoelectronic semiconductor component according to claim 1, wherein the polymer is formed with at least one polysilazane or comprises at least one polysilazane.

4. The optoelectronic semiconductor component according to claim 1, wherein the radiation-transmissive body comprises traces of material removal.

5. The optoelectronic semiconductor component according to claim 1, wherein the radiation-transmissive body contains at least one solvent and/or at least one thixotroping agent.

6. The optoelectronic semiconductor component according to claim 1, wherein the radiation-transmissive body and/or the adhesion layer exhibits a layer thickness (D1) of at least 5 μm and at most 50 μm.

7. The optoelectronic semiconductor component according to claim 1, wherein the polymer is formed with at least one polysilazane or comprises at least one polysilazane.

8. An optoelectronic semiconductor component comprising:
at least one radiation-emitting semiconductor chip comprising a radiation-outcoupling face, through which at least some of electromagnetic radiation generated in the semiconductor chip leaves the semiconductor chip; and
at least one radiation-transmissive body arranged at least in places downstream of the semiconductor chip on its radiation-outcoupling face, which body is in at least indirect contact with the semiconductor chip, wherein the radiation-transmissive body comprises traces of physical and/or mechanical material removal, the radiation-transmissive body is a lamina of self-supporting construction, at least one radiation-transmissive adhesion layer is arranged between the radiation-transmissive body and the radiation-outcoupling face having a layer thickness of at least 5 um and at most 50 um, the radiation-transmissive adhesion layer consists of a polysilazane, the radiation-transmissive body is formed with at least one polymer or contains at least one polymer, and one monomer of the polymer is formed with at least one silazane, the radiation-transmissive adhesion layer is in direct contact with the radiation-outcoupling face and the radiation-transmissive body, the radiation-transmissive body does not cover side surfaces of the semiconductor chip extending obliquely to the radiation-outcoupling face, the radiation-transmissive body does not exceed the at least one radiation-emitting semiconductor chip in a lateral direction parallel to the radiation-outcoupling face, at least one luminescence conversion material is introduced into the radiation-transmissive body, which absorbs electromagnetic radiation of one wavelength range and reemits absorbed electromagnetic radiation in another wavelength range with larger wavelengths than wavelengths the radiation-transmissive adhesion layer is free of the luminescence conversion material and other foreign particles.

* * * * *

UNITED STATES PATENT AND TRADEMARK OFFICE
CERTIFICATE OF CORRECTION

PATENT NO. : 9,142,713 B2  
APPLICATION NO. : 14/115396  
DATED : September 22, 2015  
INVENTOR(S) : Kräuter Page 1 of 1

It is certified that error appears in the above-identified patent and that said Letters Patent is hereby corrected as shown below:

In the Claims

<u>In Column 6</u>

At claim 1, at line 66, please change "wavelengths" to --wavelength--.

<u>In Column 8</u>

At claim 8, at line 9, please change "5 um and at most 50 um" to --5 μm and at most 50 μm--; and at lines 31-33, please change "the radiation-transmissive adhesion layer is free of the luminescence conversion material and other foreign particles." to --of the absorbed electromagnetic radiation, and the radiation–transmissive adhesion layer is free of the luminescence conversion material and other foreign particles.--.

Signed and Sealed this  
Twelfth Day of April, 2016

Michelle K. Lee  
*Director of the United States Patent and Trademark Office*